United States Patent [19]

Mäder

[11] Patent Number: 5,352,993
[45] Date of Patent: Oct. 4, 1994

[54] VOLTAGE CONTROLLED SAW OSCILLATOR

[75] Inventor: Heinz B. Mäder, Weinfelden, Switzerland

[73] Assignee: Telefonaktiebolaget L M Ericsson, Stockholm, Sweden

[21] Appl. No.: 954,509

[22] Filed: Sep. 30, 1992

[51] Int. Cl.$^5$ .............................................. H03B 5/20
[52] U.S. Cl. .............................. 331/107 A; 331/108 B; 331/108 C; 331/135; 331/177 R
[58] Field of Search ........... 331/107 A, 108 B, 108 C, 331/135, 136, 137, 177 R, 36 C, 34

[56] References Cited

U.S. PATENT DOCUMENTS

| | | | |
|---|---|---|---|
| 4,325,032 | 4/1982 | Gilden | 331/107 A |
| 4,571,558 | 2/1986 | Gay et al. | 331/105 |
| 4,581,592 | 4/1986 | Bennett | 331/107 A |
| 4,646,033 | 2/1987 | Perkins | 331/116 R |
| 4,743,865 | 5/1988 | Chauvin | 331/116 R |
| 4,760,352 | 7/1988 | Ash | 331/107 A |
| 4,761,616 | 8/1988 | Ash | 331/107 A |
| 4,871,984 | 10/1989 | Laton et al. | 331/107 A |
| 4,910,426 | 3/1990 | Watanabe et al. | 310/313 |
| 5,126,694 | 6/1992 | Montress et al. | 331/18 |

OTHER PUBLICATIONS

*Electronics* International, "SAW Delay Line Brings A New Balance To RF Oscillators", Mar. 2, 1978, pp. 2E, and 3E.
Patent Abstracts of Japan, vol. 12, No. 268, E-638, Mar. 3, 1988.

*Primary Examiner*—David Mis
*Attorney, Agent, or Firm*—Johnson & Wortley

[57] ABSTRACT

A voltage controlled surface acoustic wave oscillator includes an integrated circuit and a two port resonator connected as a feedback element around the integrated circuit. The integrated circuit includes a phase shifting network and an amplifier directly connected to the phase shifting network.

5 Claims, 3 Drawing Sheets

VOLTAGE CONTROLLED SAW OSCILLATOR

BACKGROUND OF THE INVENTION

1. Field of the Invention

The present invention relates to oscillators and, more particularly, to voltage controlled surface acoustic wave ("SAW") oscillators.

2. Description of Related Art

As is known in the art, there exists a need in many radio frequency applications, such as in radar receivers and transmitters, for highly stable oscillators or other sources of radio frequency signals. One of the more general approaches to fulfilling this need is to use a so-called SAW stabilized oscillator in which a SAW device such as a delay line or a resonator is disposed within a feedback loop which has an integral number of 2 pi radians of phase shift and excess small signal gain at a particular frequency within the passband frequency of the SAW stabilizing device.

In many of these applications, it is necessary to have an oscillator the output frequency of which is highly stable both over long periods of time, as well as over relatively short periods of time. The first stability characteristic is generally referred to as the aging characteristics of the oscillator and is principally related to long-term variations in the electrical characteristics of the devices comprising the SAW stabilized oscillator. More specifically, one of the major contributors to variations in oscillator performance over long periods of time may be the SAW device itself. SAW devices typically have aging rates on the order of several parts per million per year, although SAW resonators are now available having aging rates on the order of a few parts per million per year or less. Thus, aging is increasingly becoming a negligible cause of frequency instability in such devices.

Another cause of frequency instability is short-term frequency variations or noise. SAW stabilized oscillators have relatively poor close-to-carrier phase noise characteristics. That is, there exists a relatively large amount of noise power per unit of bandwidth at offset frequencies close to the carrier or fundamental frequency of the oscillator. This results principally from inherent characteristics of the SAW stabilizing element and other oscillator components such as the loop amplifiers.

A concept, besides noise, that plays a major role with respect to the background of the present invention is that of jitter, which may be time, amplitude, frequency, or phase related. Jitter refers to abrupt, spurious variations in the duration, magnitude, frequency, or phase of the frequency modulation of an interval, successive cycles, or successive pulses of a repetitive wave. Stated more simply, variations in the pulse positions within a sequence of pulses result in jitter. Some of the causes of jitter are dependent on the pulse pattern being transmitted while others are not. For example, random forms of jitter are caused by noise, interference, and mistuning of clock circuits. Pattern-dependent jitter results also from clock mistuning, from amplitude-to-phase conversion in clock circuits, and from intersymbol interference ("ISI"), which alters the position of the peaks of the input signal according to the pattern.

It is known that jitter accumulation over a digital link may be reduced by buffering the link with an elastic store and clocking out the digit stream under the control of a highly stable phase-locked loop. The elastic store is effectively a buffer that is initialized to hold a certain number of bits, and which expands and contracts to keep the bit length constant. The phase-locked loop is a circuit that uses feedback to minimize the deviation from one bit time to the next. It generally accomplishes this function by synchronizing a variable local oscillator with the phase of a transmitted signal.

With specific reference again to SAW oscillators, it is known to address some of the aforementioned needs and potential problems by including in the SAW oscillator loop a voltage controllable phase shifter which can introduce a relatively small amount of phase shift into the loop and thus adjust the frequency of oscillation of the loop or lock the frequency of oscillation to a desired frequency.

Heretofore, frequency control of SAW oscillators has been effected by means of varactor diodes. This solution suffers a disadvantage in that the component count of such frequency control systems is high, and thusly, production cost is also high.

Frequency control of various other types of oscillators has also heretofore been effected. For example, frequency control of crystal oscillators by means of a voltage controlled phase shifting network is known. However, these control systems are relatively complex. For example, the systems shown in U.S. Pat. Nos. 4,571,558 and 4,646,033 involve two integrator circuits for phase shifting purposes, and they operate the crystal in its series resonance. In any event, however, such teachings have in no way heretofore been applied to SAW oscillators.

Based upon the foregoing, it should be clear that it is a shortcoming and deficiency of the prior art that here has not yet heretofore been developed a relatively simple and inexpensive system and method for controlling the frequency of SAW oscillators.

SUMMARY OF THE INVENTION

The present invention overcomes the shortcoming and deficiencies mentioned above by providing a voltage controlled SAW oscillator including an integrated circuit and a two port resonator connected as a feedback element around the integrated circuit. According to the teachings of the present invention, the integrated circuit includes a phase shifting network and an amplifier directly connected to the phase shifting network.

In embodiments of the present invention the two port resonator may be a SAW transversal coupled filter ("TCF").

The present invention also provides a system for controlling a voltage controlled SAW oscillator, which system includes structure for stimulating oscillation, structure for controlling frequency of oscillation, structure for determining the input resistance of the system, and structure for determining the output resistance of the system. In various embodiments of the system according to the teachings of the present invention, the means for controlling the frequency of oscillation may include a multiplier circuit and a transconductance amplifier. Further, in various embodiments of the system according to the teachings of the present invention, the structure for determining the input resistance of the system, and possibly also the structure for determining the output resistance of the system, may be first and second resistors. Still yet further, in various embodiments of the system according to the teachings of the present invention, the voltage controlled SAW oscillator may include a two port resonator having a characteristic impedance, and the first and second resistors may be matched to the characteristic impedance of the two port resonator.

Accordingly, it is an object of the present invention to provide a voltage controlled SAW oscillator circuit with an integrated phase shifting network for frequency control purposes.

Another object of the present invention is to provide a frequency control section of an oscillator that does not include a varactor diode.

A further object of the present invention is to provide a voltage controlled SAW oscillator in which frequency control may be instantaneously effected.

Yet another object of the present invention is to provide a voltage controlled SAW oscillator having a relatively low component count.

Still yet another object of the present invention is to provide a relatively inexpensive voltage controlled SAW oscillator.

BRIEF DESCRIPTION OF THE DRAWINGS

For a more complete understanding of the present invention, and for further objects and advantages thereof, reference may now be had to the following detailed description of the invention taken in conjunction with the accompanying drawings wherein.

DETAILED DESCRIPTION OF THE INVENTION

Figure 1:
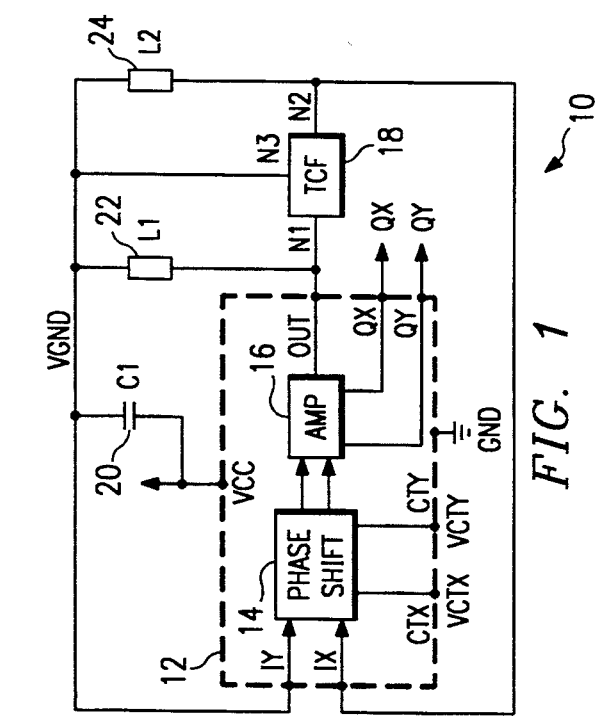
FIG. 1 is a block diagram of a voltage controlled SAW oscillator according to the teachings of the present invention.

Referring now to the drawings wherein like of similar elements are designated with identical reference numerals throughout the several views and, more particularly, to FIG. 1, there is shown a block diagram of an oscillator circuit (generally designated by reference numeral 10) according to the teachings of the present invention. The oscillator circuit 10 includes an integrated circuit 12, shown in dotted outline. The integrated circuit 12 consists of a phase shifting network 14 and of an amplifier 16. In FIG. 1 it may be seen that output OUT of the amplifier 16 is connected to a node N1 outside of the circuit 12, and, further, that it feeds an input port of a SAW TCF 18. It may also be seen in FIG. 1 that the phase shift network 12 has a CTX terminal and a CTY terminal. A frequency control voltage Vctl is applied differentially between those two terminals. Recognizing that the circuit 12 shown in FIG. 1 is merely one of many possible embodiments of the present invention, it should be understood that elements other than network 14 and amplifier 16 may be present in a circuit 12 that is still within the scope and coverage of the present invention.

The SAW TCF 18 depicted in FIG. 1 as a two port resonator, is connected as a feedback element around the integrated circuit 12. A common ground electrode N3 of the TCF 18 is connected to virtual ground VGND in order to keep the TCF 18 free of dc potential. A decoupling capacitor C1 20 is connected between VGND and VCC to establish a low impedance return path for RF current.

Parallel impedance matching networks are connected to the input port of the TCF 18 between N1 and VGND and to the output port between node N2 and VGND. The impedance matching networks are realized by inductors 22, 24 which are dimensioned to cancel the lumped susceptance of the network impedance of nodes N1 and N2. The susceptance at these nodes are primarily due to the capacitance associated with the package of the TCF 18 and of the integrated circuit 12 as well as of the printed interconnection.

Figure 2:
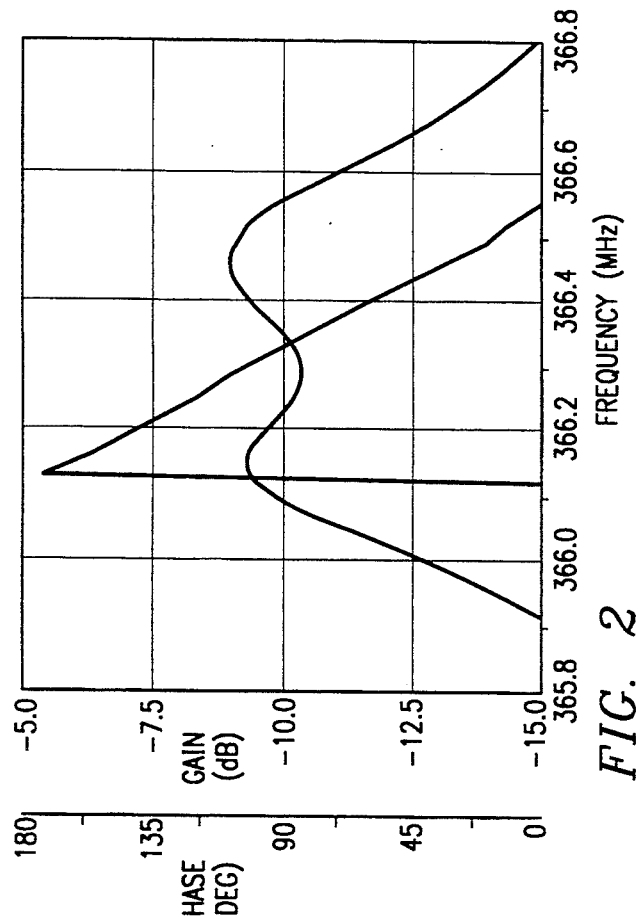
FIG. 2 is a graph of typical amplitude and phase responses for SAW two port resonators, such as the two port resonator depicted in FIG. 1.

Further with respect to SAW TCF 18, surface acoustic wave transversal coupled filters are very narrow two-pole passband filters. A typical amplitude and phase response of such a filter is depicted in FIG. 2. The characteristics of FIG. 2 have been obtained by the inventor of the present invention using circuit simulation with the generator and load impedance matched to the characteristic impedance of the TCF 18.

Key characteristics of the two-pole TCF 18 are its low insertion loss of approx. 3–5 dB, and its linear phase response in the passband. The linear phase response in the passband of the TCF 18 allows frequency control by means of a phase shifting network in the range of approximately 0° to 180°. At the center frequency the TCF 18 output leads its input by 90°; $\Phi\_tcf=90°$.

Figure 3:
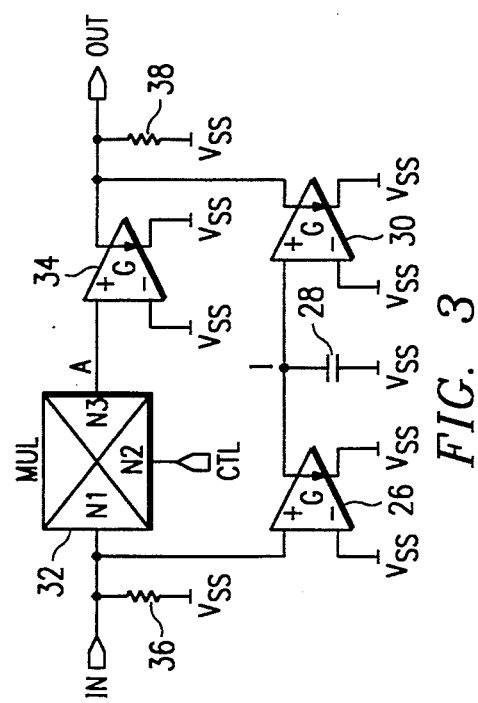
FIG. 3 is a block diagram of a phase shift and amplifier circuit according to the teachings of the present invention.

Discussing now the phase shift and amplifier circuit 12 in more detail, reference may be made to FIG. 3, which depicts that circuit 12 in block diagram form. In this circuit 12, oscillation is stimulated by a first transconductance amplifier 26, a capacitor 28, and a second transconductance amplifier 30. Frequency control means are provided by a multiplier circuit MUL 32 and a third transconductance amplifier 34. Resistors 36 and 38 determine, respectively, the input- and output resistance of the phase shift and amplifier circuit 12 and are matched to the characteristic impedance of the TCF 18 (see FIG. 1).

Now, speaking as to operation of the integrated circuit 12, when the control voltage Vctl is set to zero, it may be assumed that the output of the multiplier 32 and hence the output current of the transconductance amplifier 34 are zero. This assumption makes it convenient to understand the mode of operation of the stimulating network.

The transconductance amplifier 26 forms an integrator circuit with capacitor 28; hence, voltage Vi lags the input voltage Vin by 90°. With Vctl=0, the output voltage Vout also lags the input voltage Vin by 90° hence the TCF 18 is stimulated at its center frequency. Oscillation at the center frequency will occur provided that the loop gain of the entire oscillator circuit 10 is greater than unity.

Figure 4:
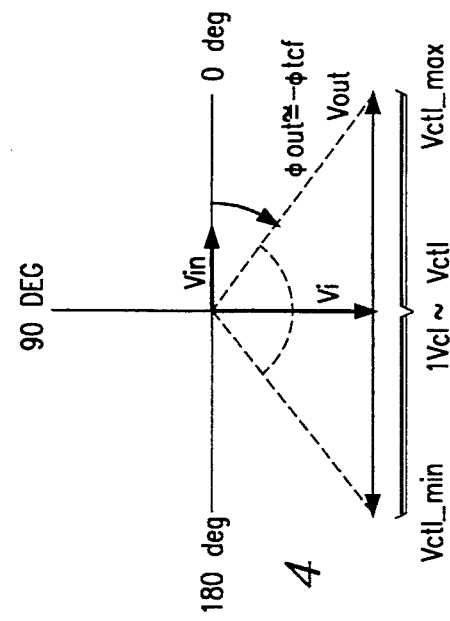
FIG. 4 is a vector diagram of the phase shift and amplifier circuit of FIG. 3.

Under control of the multiplier circuit MUL 32 the transconductance amplifier 34 provides current Ig3 to the output node which is in phase with the amplifier input Vin; hence the phase of Ig3 is in quadrature with the phase of Ig1. The magnitude of the current Ig3 is proportional to the magnitude of the control voltage Vctl, however, Ig3 is in anti-phase with Vin for Vctl<0. The resulting output voltage Vout changes its phase and magnitude as a function of the control voltage Vctl according to the vector diagram set forth in FIG. 4.

With the control voltage Vctl increasing from zero towards Vctl _max, Φ_tcf decreases from 90° to Φ_tcf_min; hence the oscillation frequency increases from the center frequency to fmax. Decreasing the control voltage below zero similarly causes Φ_tcf to increase which in turn lowers the oscillation frequency.

The magnitude of Vout increases with either an increasing or a decreasing of the control voltage Vctl. This increases the loop gain of the oscillator and further causes the oscillation amplitude to increase but has no effect on the frequency control characteristics of the oscillator.

Figure 5:
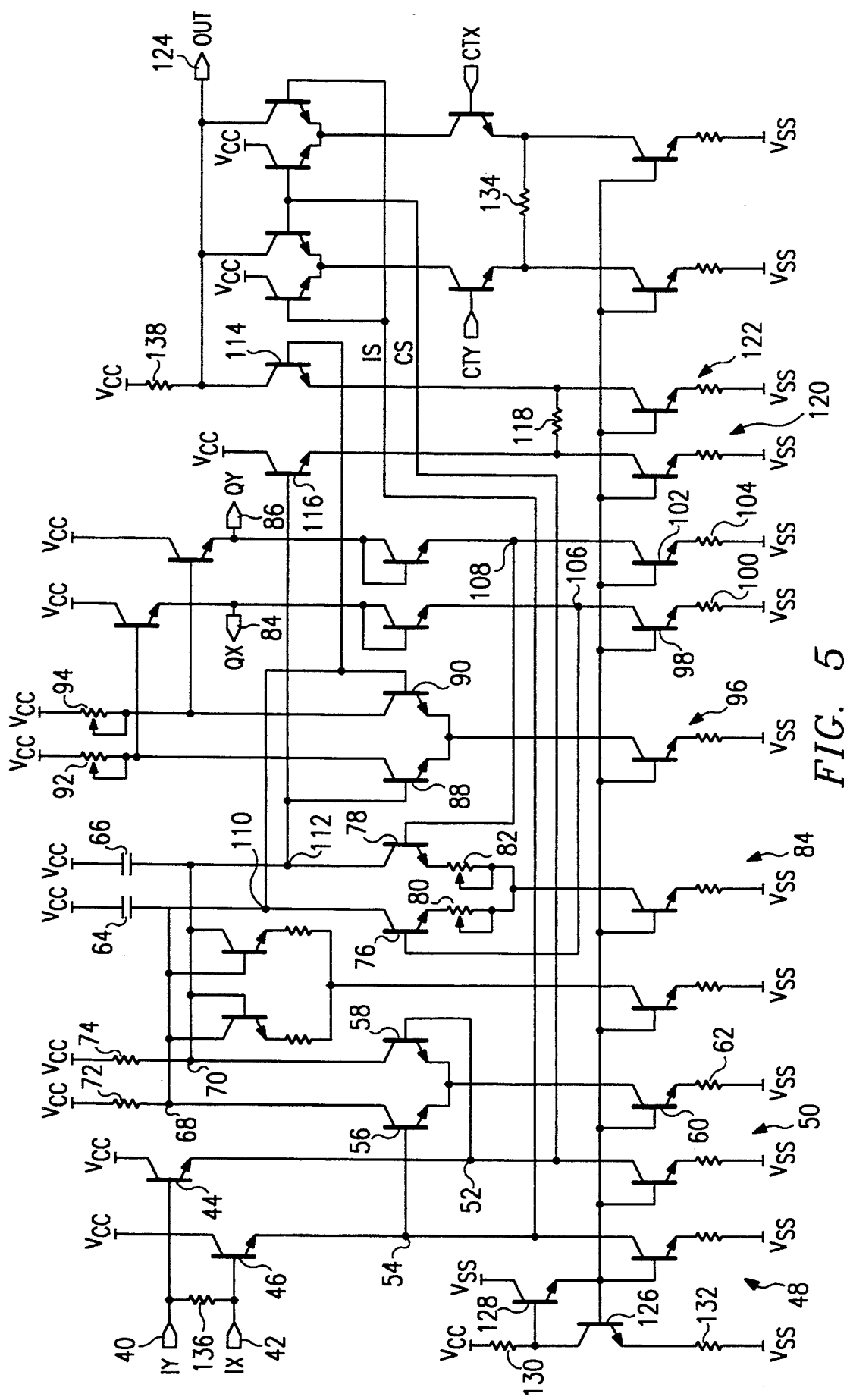
FIG. 5 is a more detailed circuit diagram of the phase shift and amplifier circuit shown in FIG. 3.

Referring now to FIG. 5, there is shown a detailed circuit diagram at the device level of the phase shift and amplifier circuit 12.

In FIG. 5 it may be seen that inputs IX 40 and IY 42 (also shown in FIG. 1) feed an emitter follower stage. These inputs are introduced in circuit 12 for level shifting purposes. The two emitter followers are formed of transistors 44, 46 and of current sinks 48, 50.

The outputs of the emitter follower, nodes 52 and 54, control the transconductance amplifier 26 (see FIG. 3) which is formed of an emitter coupled pair amplifier comprising transistors 56, 58, and the corresponding current sink consisting of a transistor 60 and a resistor 62. The differential outputs of the amplifier 26 are connected to integrator capacitors 64 and 66 (via nodes 68 and 70). Sourcing currents are provided to the emitter coupled pair amplifier by load resistors 72 and 74.

Further discussing the circuit diagram set forth in FIG. 5, a negative impedance network consisting of transistors 76 and 78, and resistors 80 and 82, together with a current sink 84, is connected in parallel with the load resistors 72 and 74. Assuming ideal devices 76 and 78 of infinite gin, the negative impedance becomes —(two times the value of resistor 76). When resistor pairs 76 and 82 are equal to resistor pairs 72 and 74, the resulting load impedance becomes infinite. It is necessary to lower the values of resistors 80 and 82 from their nominal values, mainly to compensate for the emitter resistance Re of the real devices 76 and 78. In the particular implementation disclosed in this application, the inventor of the present invention has found that the resistor values needed to be lowered by approximately 7% for best performance.

In the embodiment of the invention depicted in FIG. 5, a low-swing ECL inverter stage is provided to generate a buffered, differential clock output signal at the outputs QX 84 and QY 86. The ECL inverter consists of an emitter coupled pair amplifier formed of transistors 88 and 90, load devices 92 and 94, and the corresponding current sink 96. Emitter follower devices then provide the buffered differential clock outputs QX and QY. For level shifting purposes there are two NPN devices configured as diodes which are connected in series between the emitter follower outputs and their corresponding current sinks. The current sinks are formed of the devices 98 and 100, and 102 and 104, respectively.

To maintain the integrator circuit at its dc operating point, negative feedback is provided from the level shifted, buffered clock output nodes 106 and 108 to the integrator by means of a further transconductance amplifier. This amplifier is formed of devices 76 and 78, and the emitter degeneration resistors 80 and 82. The corresponding current sink is designated by reference numeral 96. This feedback loop unavoidably causes a phase error which can be minimized by reducing the gm of the feedback amplifier by means of the emitter degeneration resistors 80 and 82. An integrator phase error on the order of less than 8° has been achieved by the inventor of the present invention.

The integrator output nodes 110 and 112 further control the transconductance amplifier 30 (see FIG. 3) consisting of the emitter coupled pair amplifier formed of devices 114 and 116, an emitter degeneration resistor 118, and current sinks 120 and 122. The collector current of device 114 feeds the single ended output OUT 124 while the complementary output current at the collector of device 116 is returned to the power supply terminal VCC.

All current sinks are controlled by an on-chip bias network formed of the devices 126, 138, 130 and 132; hence the currents are proportional to VCC-(2 times Vbe).

It may be noted that the foregoing description describes the stimulating path of the voltage controlled SAW oscillator 10. The described network could be used as a reference SAW oscillator without frequency control. In such an oscillator, oscillation would occur at the center frequency of the SAW TCF 18 (shown in FIG. 1).

The frequency control system of the present invention, including a four-quadrant multiplier circuit and a transconductance amplifier, has been implemented as a Gilbert multiplier cell. In that embodiment, the gain of the frequency control inputs is set by an emitter degeneration resistor 134. Further, in that embodiment the current sinks of the Gilbert multiplier circuit are dimensioned with respect to the current sinks of the transconductance amplifier 30 (shown in FIG. 3) in a ratio of 1.16:1 so that a phase control range of approx. ±50° results.

The input and output resistor values of resistors 136 and 138 may be lowered from the characteristic impedance of the TCF 18 in order to make the oscillator 10 less sensitive to production tolerances of the matching impedance networks. This benefit is unfortunately accompanied by making the phase response of the TCF, and hence of the VCO, less linear but can contribute to maximizing frequency control in view of all production tolerances. A further disadvantage is that lowering the input and output resistor values of resistors 136 and 138 causes an increase in the insertion loss of the TCF; this can, however, be compensated for by increasing the gain of the amplifier.

Figure 6:
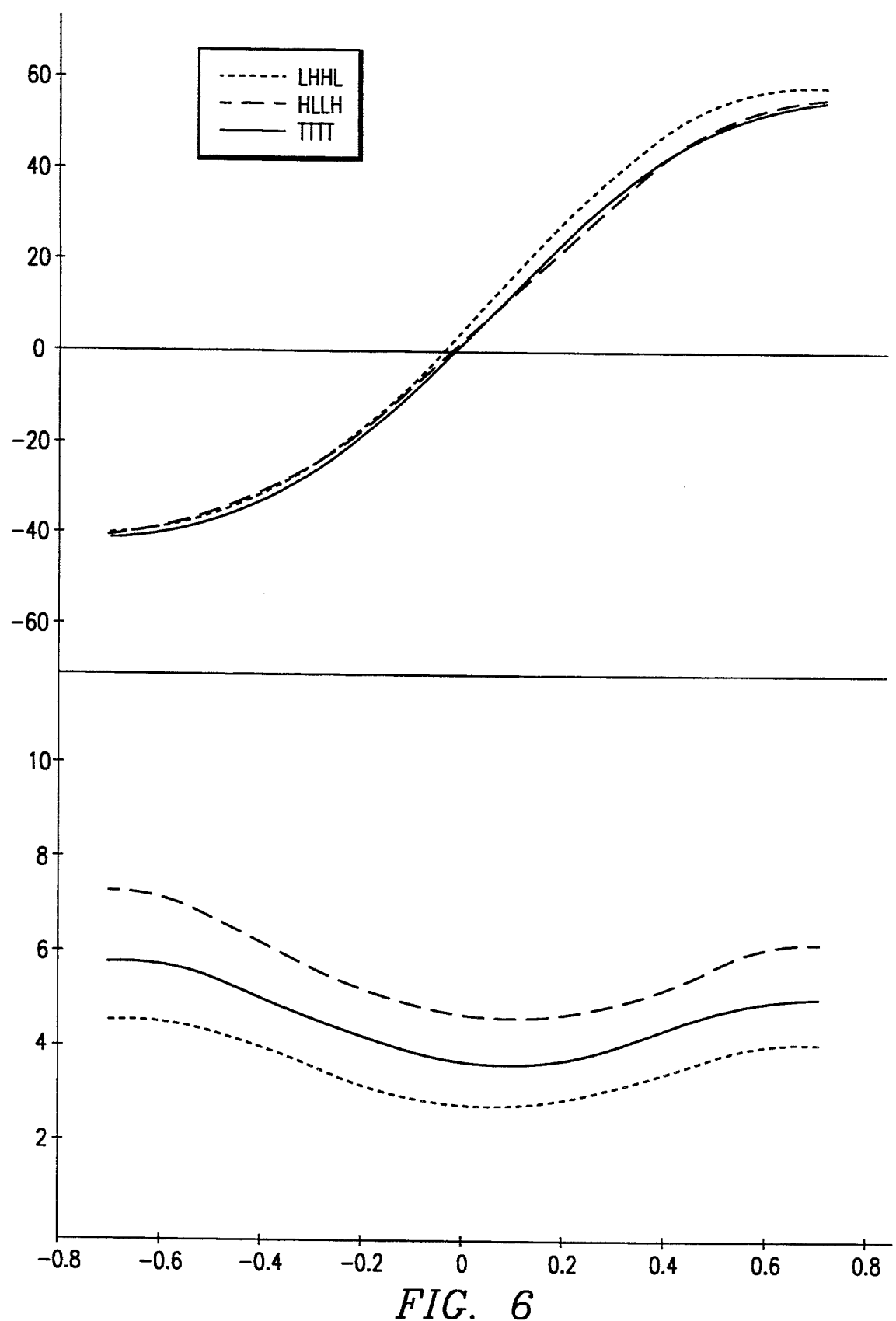
FIG. 6 is a graph of certain performance characteristics of the phase shift and amplifier circuit of FIG. 3.

Referring now to FIG. 6, there is graphically shown phase and magnitude versus Vctl for the phase shift and amplifier circuit. The depicted values illustrate firm control of phase shift by voltage, which is entirely sufficient for strong frequency control. On the graph, TTTT denotes typical values; HLLH denotes worst case values; and LHHL denotes best case values. Also on the graph, control voltage values are plotted along the X-axis, and phase and magnitude values are plotted along the Y-axis.

Based upon the foregoing, those skilled in the art should now fully understand and appreciate that the present invention provides a voltage controlled SAW oscillator circuit with an integrated phase shifting network for frequency control purposes. Embodiments of the present invention do not require use of a varactor diode, a device widely applied in the prior art. Since the frequency control section of the provided oscillator does not include a varactor diode, the component count of the circuit is reduced. Also, because a varactor diode is not employed in embodiments of the present invention, frequency control is instantaneous. In embodiments of the present invention, only one integrated circuit need be provided, comprising a phase shifting network, an amplifier, a SAW TCF, and a decoupling capacitor. In some embodiments of the present invention, parallel impedance matching networks connected to the input and output ports of the SAW TCF may also be provided, either as separate elements or incorporated into the SAW TCF. Low production cost of embodiments of the present invention is a direct benefit of the low component count.

Obviously, numerous modifications and variations are possible in view of the teachings above. Accordingly, within the scope of the appended claims, the present invention may be practiced otherwise than as specifically described herein above.

It is believed that the operation and construction of the present invention will be apparent from the foregoing description. While the method and apparatus shown and described has been characterized as being preferred, obvious changes and modifications may be made within without departing from the scope of the invention as defined in the following claims.

What is claimed is:

1. An oscillator comprising:
    an integrated circuit comprising:
        a phase shifting network, and
        an amplifier connected to said phase shifting network; and
    a resonator having an input port and an output port connected as a feedback element around said integrated circuit, wherein said phase shifting network comprises a multiplier having an input terminal and an output terminal, a first transconductance amplifier connected in circuit to said output terminal of said multiplier, and a second transconductance amplifier and a third transconductance amplifier connected in series and in circuit in parallel to said multiplier and said first transconductance amplifier.

2. An oscillator as recited in claim 1, wherein said resonator is a surface acoustic wave transversal coupled filter.

3. An oscillator as recited in claim 1, wherein said amplifier has an output port, and further comprising means for connecting said output port of said amplifier to said input port of said resonator.

4. A voltage controlled surface acoustic wave ("SAW") oscillator comprising:
    an integrated circuit formed on an insulative substrate which includes
        an amplifier having a pair of input terminals, an output terminal, a first signal output terminal, and a second signal output terminal,
        a phase shift network having a first input, a second input and a pair of phase shifted outputs, said outputs being connected to the pair of inputs of said amplifier, and
        a SAW transversal coupled filter having an input terminal, an output terminal, and a common ground terminal, said input terminal of said SAW transversal coupled filter connected to the output terminal of said amplifier, said output terminal of said transversal coupled filter connected to the second input of said phase shift network and to an inductor, and said common ground terminal connected in circuit to a point between said inductor and said first input of said phase shift network, wherein said phase shifting network comprises a multiplier having an input terminal and an output terminal, a first trans conductance amplifier connected in circuit to said output terminal of said multiplier, and a second transconductance amplifier and a third transconductance amplifier connected in series and in circuit in parallel to said multiplier and said first transconductance amplifier.

5. A voltage controlled surface acoustic wave oscillator as recited in claim 4, comprising a second inductor connected in circuit at one point between said first inductor and said first input of said phase shift network and at a second point between said output terminal of said amplifier and said input terminal of said SAW transversal coupled filter.

* * * * *